United States Patent [19]

Luke et al.

[11] Patent Number: 4,469,959
[45] Date of Patent: Sep. 4, 1984

[54] INPUT BUFFER

[75] Inventors: Kevin Luke; Robert N. Allgood, both of Austin, Tex.

[73] Assignee: Motorola, Inc., Schaumburg, Ill.

[21] Appl. No.: 357,547

[22] Filed: Mar. 15, 1982

[51] Int. Cl.³ .................... H03K 5/02; H03K 19/092
[52] U.S. Cl. ................................. 307/264; 307/451; 307/475
[58] Field of Search ................ 307/264, 475, 296 R, 307/297, 451, 469

[56] References Cited

U.S. PATENT DOCUMENTS

| | | | |
|---|---|---|---|
| 4,032,795 | 6/1977 | Hale | 307/264 |
| 4,258,272 | 3/1981 | Huang | 307/475 |
| 4,406,957 | 9/1983 | Atherton | 307/475 |

*Primary Examiner*—John Zazworsky
*Attorney, Agent, or Firm*—Anthony J. Sarli, Jr.; Jeffrey Van Myers

[57] ABSTRACT

An input buffer circuit for translating TTL level inputs to CMOS levels and which constitutes a part of a monolithic semiconductor device is provided. An input inverter stage has the source of its load transistor connected via a bipolar transistor to a first voltage level. When a second voltage level at which the monolithic semiconductor device is intended to operate exceeds the first voltage level, an MOS transistor coupled in parallel with the bipolar transistor bypasses the bipolar transistor and connects the source of the load transistor directly to the first voltage level, thus eliminating the $V_{BE}$ drop of the bipolar transistor. The bypass means compensate for the body effect of the load transistor and maintain the switch point of the input inverter stage at a relatively constant point.

4 Claims, 1 Drawing Figure

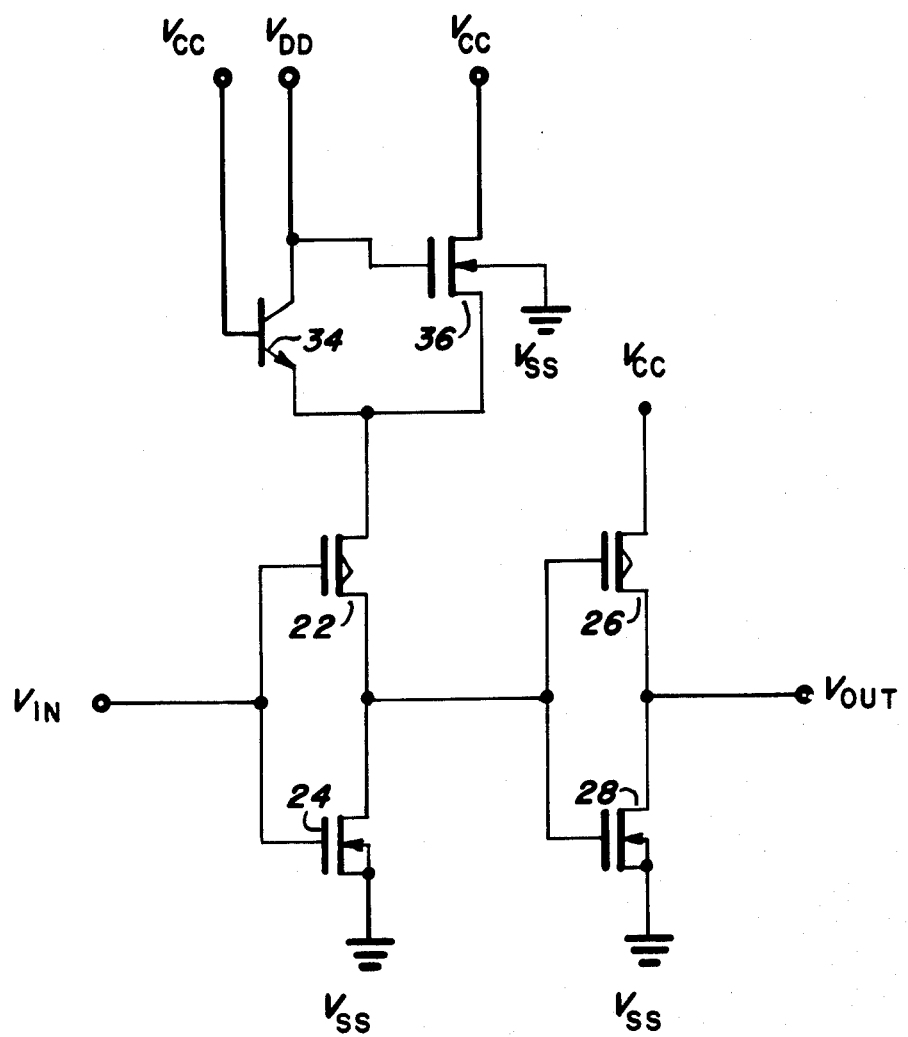

INPUT BUFFER

TECHNICAL FIELD

This invention relates to voltage level shifters, and more particularly to circuits for shifting from standard TTL logic voltage levels to stable CMOS voltage levels in order to drive other CMOS circuits on the same monolithic semiconductor chip.

BACKGROUND ART

Conventional bipolar integrated circuit logic circuits operate at low voltage logic levels. Typically, a low or zero logic level as specified for TTL logic circuits may range from 0.0 to 0.8 volt. A high or one level may be specified by any voltage in the range of 2 volts to 5 volts. Thus, in order to distinguish between logic "0" levels and logic "1" levels, a circuit must be capable of switching between a "0" level and a "1" level somewhere between 0.8 and 2 volts, preferably at approximately 1.4 volts in order to give the widest margins of reliability.

While TTL logic operates at the voltage and switching levels noted above, with a supply voltage $V_{CC}$ typically being 5 volts, MOS logic, and particularly CMOS logic may operate at higher voltages, with a supply voltage $V_{DD}$ typically being in a range of 4.5 to 15 volts. Since the high available densities of MOS circuitry make MOS technology particularly suitable for very large scale integrated circuits or functions, and since much of the interface circuitry used to provide inputs and controls to the VLSI MOS functions are TTL level circuits, a convenient mechanism must be available to translate TTL logic levels to MOS levels such that, on the remainder of the MOS monolithic circuit, gates of the MOS FETs can be driven between ground and $V_{DD}$.

One very desirable attribute of a level shifting circuit is the maintenence of an accurate and well defined switch point, above which the TTL to MOS level shifting circuit will recognize an input as a "1" logic level and below which it will recongize a "0" logic level input, and translate these to 5 or 0 volts at the output of the circuit, respectively.

High-speed level shifters are conventionally implemented with low gain differential comparators. While such circuits are fast, they are also quite large and draw significant amounts of current. Additionally, such circuits require bias lines which usually have associated therewith external resistors.

The instant invention provides a circuit which, while not as fast as these noted above, is small, draws very little power, and requires no external resistors or biasing lines.

Other prior art circuits utilized an input inverter stage with a P-channel transistor having its drain connected to the drain of an N-channel transistor and the gates connected together to form an input node. The source of the P-channel transistor was connected to $V_{DD}$ (the positive voltage supply) and the source of the N-channel transistor was connected to $V_{SS}$ (the lowest or negative voltage supply). When $v_{DD}$ was 5 volts and $V_{SS}$ was 0 volts, it was possible to select the transistor size ratios such that the switch point of the inverter approximated 1.4 volts.

As long as the supply ($V_{DD}$) at which the chip was to operate did not vary significantly, the switch point of the previously mentioned level shifter could be reasonably closely controlled by selecting the ratios of the transistors of the input inverter in such a manner as to provide the proper switch point.

As the difference in voltage between the source of the P-channel device and the source of the N-channel device increased, i.e., as $V_{DD}$ increased with respect to $V_{SS}$, the ratio between the N-channel and P-channel device strengths had to increase to maintain the switch point of the level shifter. The P-channel device was made weaker than the N-channel device because the P-channel device has a higher gate to source voltage than the gate to source voltage of the N-channel device at the switch point. A high ratio of N-channel to P-channel device strength creates problems in MOS IC layout, because the P-channel device typically has a small width and large channel length. As can be shown from the simulatneous application of the saturated current equations and the transconductance equations for both the P-channel and N-channel devices, a low N to P strength ratio is also desirable since the level shifter switch point can be controlled better over process and operating conditions. Therefore, the inclusion of a bipolar transistor (connected as a transistor or a diode) between the source of the P-channel device and $V_{DD}$ provides a P-source to N-source voltage of $V_{DD}-V_{BE}$ volts. When $V_{DD}$ is 5 volts, the P-channel source voltage is approximately 4.4 volts, allowing a smaller ratio between the N-channel and P-channel device strengths because the gate to source voltage of the P-channel device is smaller at the switch point.

If it is desired to operate the chip at a voltage $V_{DD}$ in excess of 5 volts (or with a range of voltage $V_{DD}$) it becomes difficult to maintain the switchpoint within specified limits. Accordingly, an object of this invention is to provide a level shift circuit which allows operation with $V_{DD}$ at various levels while maintaining a desired input switch point.

SUMMARY OF THE INVENTION

These and other objects and advantages of the invention are accomplished by providing a level shifting circuit wherein the source of a P-channel transistor, which is the load of an input inverter stage, is connected through a bipolar transistor to a firt voltage level, and, when a second voltage level at which the monolithic semiconductor is intended to operate substantially exceeds the level to which the source is coupled through the bipolar transistor, an MOS transistor bypasses the bipolar transistor and connects that source directly to the first voltage level, thus eliminating the $V_{BE}$ drop of the bipolar transistor.

BRIEF DESCRIPTION OF THE DRAWINGS

The invention may be more clearly understood by reference to the drawings in which the FIGURE shows a schematic diagram of a circuit according to the instant invention.

DETAILED DESCRIPTION OF A PREFERRED EMBODIMENT

In similar prior circuits, as noted above, the source of P-channel transistor 22 was connected as shown in the drawing to the emitter of a bipolar transistor such as bipolar transistor 34 which may alternatively be connected as a diode, i.e., base and collector connected together.

The only method of fabrication of a useful bipolar transistor in P-well CMOS technology is with the collector connected to $V_{DD}$. A direct connection of the source of transistor 22 to reference voltage level $V_{CC}$ is not a viable approach since the N to P ratio between transistors 24 and 22 would be higher as explained above. Thus a $V_{BE}$ or diode voltage drop (about 0.6 volt) is desirable between $V_{CC}$ and the source of transistor 22 in order to reduce the N to P ratio of inverter pair 24-22.

The integrated circuit of the instant application is intended to operate at any voltage $V_{DD}$ from 4.5 to 15 volts. In the prior art, since the substrate or bulk of all P-channel transistors is at $V_{DD}$ in P-well CMOS technology, as $V_{DD}$ exceeds $V_{CC}$ a phenomenon known as body effect or back-gate bias causes the threshold of transistor 22 to increase.

The increased threshold of P-channel transistor 22 makes transistor 22 relatively weaker compared to N-channel transistor 24, thus causing the inverter 22-24 switch point to decrease with increasing $V_{DD}$.

The FIGURE shows an improved input buffer circuit which comprises a first pair of transistors, P-channel transistor 22 and N-channel transistor 24 connected as an inverter with the input node of the inverter connected to an input terminal for receiving a TTL voltage level input $V_{in}$. The output node of the inverter is connected between the drains of the respective transistors and this node forms an input drive to a second inverter stage, 26-28, which acts as a buffer to reduce load capacitance on the input inverter, since the input inverter 22-24 utilizes relatively small and weak transistors to minimize power consumption. The second inverter (buffer) has one P-channel transistor 26 and one N-channel transistor 28 connected similarly as the first inverter stage. The source of the P-channel transistor of the buffer stage is connected to a voltage level $V_{CC}$ which may, in this case, be 5 volts.

In order to overcome the disadvantages of the prior art as noted previously with respect to variations in the switch point occasioned by threshold variations due to body effect, the source of P-channel transistor 22 is connected to the emitter of a bipolar transistor 34 as discussed above which may be formed in a P-well in an N-type substrate of the CMOS monolithic circuit. The base of bipolar transistor 34 is connected to $V_{CC}$ and the collector is connected to $V_{DD}$. (It should be noted again that ultimately in this preferred embodiment, the remainder of the CMOS circuit will be operated at $V_{DD}$, usually at a 5, 10 or 12 volt level.) An additional voltage shifting or translating stage beyond that disclosed in the instant embodiment may be employed to raise the high logic level of the remaining circuitry from a $V_{CC}$ level to a $V_{DD}$ level. This may be accomplished by cross-coupled level shifters well known in the art. Also connected to $V_{DD}$ is the gate of an MOS bypass transistor 36 which is an N-channel device having its drain connected to $V_{CC}$ and its source connected to the source of P-channel transistor 22 and to the emitter of bipolar transistor 34.

The voltage supply circuit to the source of P-channel transistor 22 may vary due to design consideration or availability of supply levels. When $V_{CC}$ and $V_{DD}$ are at approximately the same level, i.e., 5.0 volts, the source of transistor 22 will be supplied with a voltage of approximately 5.0 volts minus 0.6 volt, which is the $V_{BE}$ voltage drop of the bipolar transistor. This estabilishes the nominal operating voltage on the source of P-channel transistor at approximtely 4.4 volts and maintains the switch point of inverter 22-24 at approximately the preferred 1.4 volt level.

When $V_{CC}$ and $V_{DD}$ are at the respective typical TTL and CMOS levels of approximately 5 volts and 12 volts, transistor 36 would be turned on to compensate for the previously mentioned body effect phenomenon. With a 12 volt gate voltage and 5 volt drain voltage, transistor 36 turns on completely, bypasses transistor 34, and holds the source of transistor 22 at approximately $V_{CC}$, which in this case is 5 volts. The increase in source voltage on transistor 22 results in transistor 22 having both a higher gate to source voltage at the switch point of inverter 22-24 and a slightly lowered threshold due to the decreased body effect. Both of these effects cause the switch point of inverter 22-24 to remain at approximately the preferred value of 1.4 volts with $V_{DD}$ greater than $V_{CC}$ rather than decline steadily as VDD increased as in the prior art.

The N-channel transistor 36 is a relatively small device and is, in a preferred form, in a grounded P-well. Transistor 36 has its own body effect, and therefore its threshold is quite high; the device will not turn on until approximately 8 volts is applied to its gate. In the preferred embodiment the device is sized such that it turns on smoothly as $V_{DD}$ increases between about 8 and 11 volts. Further, transistor 36 is also sized such that the switch point of the inverter 22-24 remains stable during changes in the threshold of transistor 22 due to the body effect.

In operation, the effect of application of a TTL level signal of differing values at the inverter input $V_{in}$, (assuming for simplicity $V_{CC}=5$ volts, $V_{DD}=12$ volts, and $V_{SS}=0$) will be explained below. With $V_{in}$ at 0 volts, transistor 24 is turned off and transistor 22 is turned on but draws no current other than that caused by leakage paths because there is no DC path to $V_{SS}$. The source of transistor 22 is at approximately $V_{CC}$ because transistor 36 is turned on strongly. Thus, the output of inverter 22-24 is at approximately $V_{CC}$ and the output of inverter 26-28 is at approximately $V_{SS}$. When $V_{in}$ increases to approximately the previously mentioned lower TTL switch point value of 0.8 volt, transistor 24 begins to turn on causing current to be drawn through transistors 22 and 24. When $V_{in}$ reaches approximately the preferred switch point of 1.4 volts, transistors 22 and 24 have approximately equal values of saturated drain currents. Since inverter 22-24 is in a high gain configuration, a small increase (e.g. 100 millivolts) at $V_{in}$ above the inverter 22-24 switch point will cause the output of inverter 22-24 to rapidly go to near $V_{SS}$ and hence the output of inverter 26-28 becomes $V_{CC}$.

When $V_{in}$ reaches 2 volts, the gates of transistors 26 and 28 should be well above the CMOS switch point of approximately one-half $V_{CC}$ and the buffer will have completely switched from its original state. Current through transistors 22 and 24 will decrease because the gate-source voltage on transistor 22 is decreasing. If $V_{in}$ is raised all the way to 5 volts, transistor 22 turns off and its source is again at $V_{cc}$. The input voltage of transistors 26 and 28 should be at $V_{ss}$ because transistor 24 will be turned on hard with no source for the current it is capable of sinking. If the input voltage is raised above 5 volts, the circuit continues to recognize a high TTL input.

While an example has been shown of the circuit with certain voltage levels, it is understood that the same principle is applicable to voltage level translating circuits where different specific voltages are usable. Additionally, if the N-channel transistors were substituted for P-channel transistors and the P-channel transistors were substituted for N-channel transistors, and if the voltages were inverted (i.e. 15 volts becomes −15 volts), the circuit could be implemented as an inverted logic circuit. Other changes and modifications may occur to practitioners skilled in the art. It is intended, however, that the scope of the instant invention be governed only by the scope of the claims appended hereto.

We claim:

1. A circuit for translating an input signal having a range of voltage levels to an output signal with a different range of voltages comprising:
   a terminal for receiving an input signal having a plurality of possible states;
   an inverter comprising a pair of MOS transistors of opposite conductivity type, with the drains of the MOS transistors connected together and forming an output node and the input of the inverter coupled to the terminal;
   a first voltage source and a second voltage source;
   transistor means for coupling one of said MOS transistors to the first voltage source; and
   bypass means for coupling said one of said MOS transistors to the first voltage source, said bypass means responsive to the second voltage source for bypassing said transistor means to couple said one of said MOS transistors directly to the first voltage source.

2. An improved buffer for shifting the voltage level of an input signal which is coupled to an input terminal, to a different voltage level as an output signal provided at an output terminal comprising:
   first and second transistors of first and second conductivity types providing an inverter having an input connected to said input terminal and an output node formed by the common drains of the transistors;
   transistor means coupled to said first transistor, for coupling said first transistor to a first supply voltage; and
   bypass means coupled to both said first transistor and said transistor means, said bypass means responsive to a second supply voltage for bypassing said transistor means to couple said first transistor directly to said first supply voltage.

3. The improved input buffer of claim 2 wherein said transistor means comprise a bipolar transistor having a collector coupled to both said second supply voltage and said bypass means, a base coupled to said first supply voltage and an emitter coupled to both said first transistor and said bypass means.

4. The improved input buffer of claims 2 or 3 wherein said bypass means comprise a transistor of said second conductivity type having a drain coupled to said first supply voltage, a gate coupled to both said second supply voltage and said transistor means and a source coupled to both said transistor means and said first transistor.

* * * * *